United States Patent
Mordkovich

(10) Patent No.: US 6,549,084 B1
(45) Date of Patent: Apr. 15, 2003

(54) LOW PHASE NOISE VARIABLE FREQUENCY OSCILLATOR

(75) Inventor: Mikhail Mordkovich, Brooklyn, NY (US)

(73) Assignee: Scientific Components, Corp., Brooklyn, NY (US)

( * ) Notice: Subject to any disclaimer, the term of this patent is extended or adjusted under 35 U.S.C. 154(b) by 0 days.

(21) Appl. No.: 09/576,932

(22) Filed: May 24, 2000

Related U.S. Application Data

(60) Provisional application No. 60/164,097, filed on Nov. 8, 1999.

(51) Int. Cl.[7] .................................................. H03B 5/12
(52) U.S. Cl. ........................... 331/117 R; 331/177 V; 331/179; 331/107 SL; 331/117 R; 331/167
(58) Field of Search .................... 331/177 V, 117 R, 331/167, 179, 107 SL, 117 D, 96

(56) References Cited

U.S. PATENT DOCUMENTS

| | | | | |
|---|---|---|---|---|
| 4,146,850 A | * | 3/1979 | Fache et al. | 331/117 R |
| 5,748,051 A | * | 5/1998 | Lewis | 331/117 R |

* cited by examiner

Primary Examiner—Arnold Kinkead
(74) Attorney, Agent, or Firm—Kevin Redmond

(57) ABSTRACT

A variable frequency oscillator which exhibits low phase noise by increasing the quality factor of the resonator in the oscillator circuit. This is achieved by employing multiple means of decoupling the resonator from all elements and circuits to which the resonator is connected. For example, the resonator is decoupled from the whole oscillator circuitry by connecting the oscillator to a tap on the resonator which reflects the oscillator as a lighter load across the entire resonator. The resonator is further decoupled from the emitter to the base junction circuitry by placing a impedance network between the base of the transistor and the ground. Additional decoupling circuitry is employed to reduce the loading of the resonator due to the external oscillator load.

8 Claims, 1 Drawing Sheet

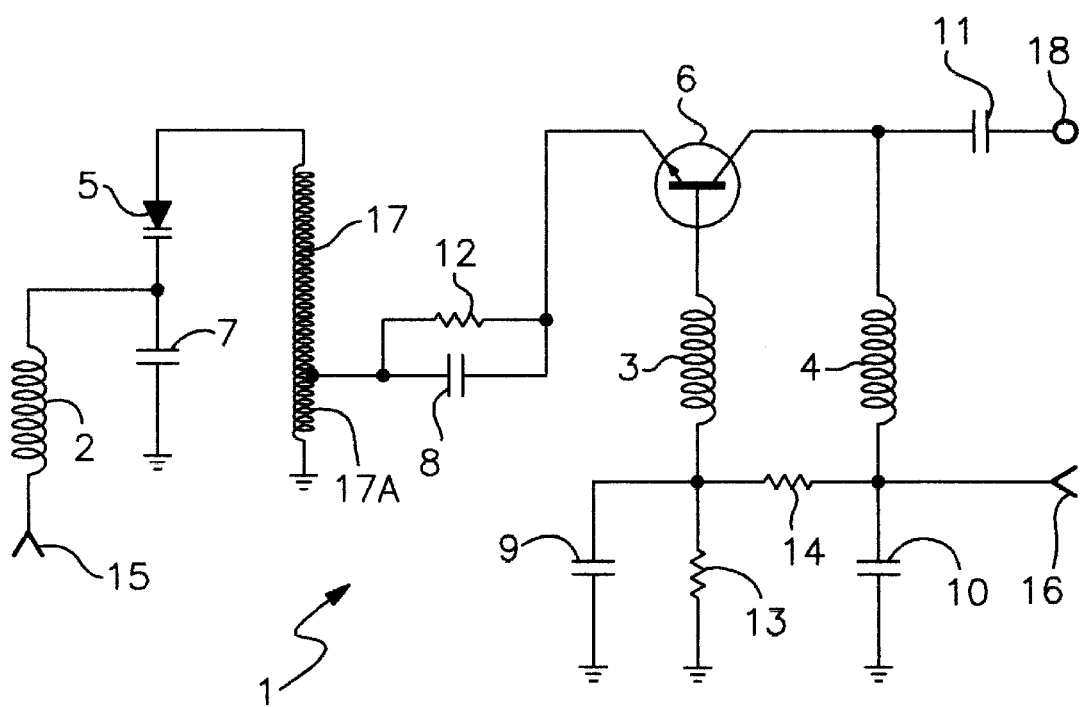

LOW PHASE NOISE VARIABLE FREQUENCY OSCILLATOR

This application claims the benefit of Provisional Application No. 60/164,097, filed Nov. 8, 1999.

BACKGROUND

1. Field

The present invention relates generally to RF oscillators and more particularly to voltage control oscillators designed to provide low phase noise.

2. Prior Art

There a number of U.S. patent references relating to variable frequency oscillator circuits which exhibiting low phase noise including U.S. Pat. Nos. 5,357,218, 5,185,583, 5,512,862, 5,268,657, 5,625,327, and 4,593,256. One of the principle methods of producing low phase noise in a variable frequency oscillator that is found in all of these references is the use of a resonator circuit with a high loaded Q. The principal way of obtaining a high loaded Q is to tap into the resonator rather than connect directly across it. This method transforms the impedance placed across the tap to a higher impedance across the entire resonator, thereby raising the loaded Q of the resonator. All of the reference patents use a tapped resonator in one form or another. Most connect into a direct tap on an inductor; however, in U.S. Pat No. 5,625,327 the tap is made by a capacitive divider across the resonator.

BRIEF DESCRIPTION OF THE DRAWING

FIG. 1 is a schematic drawing of the present invention.

SUMMARY

A low phase noise variable frequency oscillator which reduces phase noise by decoupling resonator in three ways. The oscillator is coupled to the resonator by way of a tap on the resonator to reduce the oscillator load on the resonator. An impedance is placed between the oscillator and ground. The oscillator is lightly coupled to the output load.

The principal element in the resonator of the present invention is a printed circuit transmission line which is tapped to make a connection to the oscillator circuit that only lightly loads the resonator. To further reduce the loading of the oscillator circuit on the resonator, the only other connection made to the resonator is the varactor which is connected across the entire resonator to maximize the tuning ability. The impedance of the circuit and the load are raised by placing a additional impedance between the base of the transistor and the ground and also between the output of the oscillator and output load. The combination of all these load reducing techniques provides an oscillator with superior phase noise characteristics of −88 dBc/Hz at 1 kHz offset and −110 dBc/Hz at 10 kHz offset at 1.4 GHz carrier frequency, which is 10 to 15 dBc/Hz better than most comparable available oscillators.

DETAIL DESCRIPTION OF THE INVENTION

The variable frequency oscillator circuit 1 shown in FIG. 1 includes a resonator 17, inductors 2, 3, 4, varactor diode 5, transistor 6, capacitors 7 through 11, resistors 12 through 14, tuning voltage input port 15, supply voltage input port 16, and RF output port 18. The resonator 17 is a printed circuit transmission line having a first and second end. The printed circuit transmission line can be a microstrip line. The second end of resonator 17 is grounded and the first end is connected to the varactor 5 which is connected to ground at its opposite end through capacitor 7. One end of inductor 2 is connected to the junction of the varactor 5 and the capacitor 7. The opposite end of inductor 2 is connected to the tuning voltage input port 15. The resonator 17 has a tap near its ground end which is connected to a first end of a network consisting of resistor 12 and capacitor 8 connected in parallel. The opposite end of this network is connected to the emitter of transistor 6. The collector of transistor 6 is connected to the output port 17 by way of capacitor 11. The base of transistor 6 is connected through inductor 3 to the parallel combination of resistor 13 and capacitor 9 which are both connected at their opposite ends to ground. The supply voltage input port 16 is connected to one end of the inductor 4. The other end of that inductor is connected to the collector of the transistor 6. The supply voltage input port 16 is RF bypassed to ground through capacitor 10. The bias for the base of the transistor is provided by a resistive divider consisting of resistors 13 and 14. One end of resistor 14 is connected to port 16 while the other end is connected to the junction of resistor 13, capacitor 9 and inductor 3.

The DC connections for transistor 6 are conventional. The DC power flows from supply voltage input port 16 through collector choke 4 to the collector of the transistor. The emitter of transistor 6 is DC connected to ground by way of resistor 12 and the resonator 17. The resistor 13 and 14 form a voltage divider between the supply voltage input port 6 and ground for the base of transistor 6. The bias is fed from the tap between the resistors 13 and 14 through choke 3 to the base. Capacitor 9 is an RF return to ground for the base circuit. Capacitor 8 provides an RF connection for the emitter of transistor 6 to the resonator 17. Capacitor 11 serves as the RF connection to the output port while blocking DC from either entering or leaving this port.

The varactor 5 is placed across resonator 17 by a direct connection to the first end of the resonator. The opposite end of the varactor is connected to RF ground by way of the RF coupling capacitor 7. Inductor 2 serves to block the flow of RF out to the varactor control voltage line, but still allows the flow of DC into the varactor circuit. The DC return for the varactor is through the resonator 17 which has its second end grounded.

In the operation of this circuit, the resonator 17 forms a parallel resonant circuit with the varactor 5. The varactor can be tunned by varying the voltage on the varactor which is applied through the tuning voltage input port 15. Transistor 6 is fundamentally configured as a common base amplifier. The resonator circuit provides the RF return for the emitter of transistor 6 to ground.

Phase noise is reduced by maintaining a high loaded Q in the resonator circuit. This is accomplished by lightly loading the resonator in three ways. The load placed by oscillator on the resonator is reduced by connecting the oscillator to a tap on the resonator rather than across the whole resonator. The load presented by the oscillator is further reduced by returning the oscillator to ground through a relatively high impedance in the base of the transistor 6. The load placed by the external oscillator load at port 18 is reduced by the relatively high impedance of capacitor 11.

The relative magnitude and the effect of the components used to reduce the load on the resonator can be seen by examining a practical example of an oscillator operating in accordance with the present invention at a frequency of 1.4 GHz. The practical values used in this circuit are listed below.

| Component | Value | Impedance at | MHz |
|-----------|-------|--------------|------|
| C8 | 6.8 pF | −j17 ohm | 1400 |
| L3 | 2.2 nH | j20 ohm | 1400 |
| C11 | 2.2 pF | −j52 ohm | 1400 |

The resonator tap is made at 30 to 50% (0.3 to 0.5) of the total resonator length as measured from the ground end of the resonator. The impedance value of capacitor C11 shown above can range from −j40 to −j60 ohms. The impedance value of inductor L3 shown above can range from j20 to j30 ohms.

What is claimed to be new and desired to be protected by Letters Patent is set forth in the appended claims.

I claim:

1. A variable frequency oscillator having low phase noise characteristics, comprising:
   a) a transistor having an emitter, a collector and a base;
   b) a first inductor having a first terminal and a second terminal, said first terminal connected to said base;
   c) a first capacitor having a first terminal and a second terminal, said first terminal connected to said second terminal of said first inductor, and said second terminal connected to ground;
   d) a first resistor having a first terminal and a second terminal, said first terminal connected to the junction of said first capacitor and said first inductor, and said second terminal connected to ground;
   e) a second resistor having a first terminal and a second terminal, said first terminal connected to the junction of said first capacitor and said first inductor;
   f) a second capacitor having a first terminal and a second terminal, said first terminal, connected to said second terminal of said second resistor, and said second terminal connected to ground;
   g) a third capacitor having a first terminal and a second terminal, said first terminal connected to said collector;
   h) an RF output terminal connected to said second terminal of said third capacitor;
   i) a second inductor having a first terminal and a second terminal, said first terminal connected to the junction of said third capacitor and said collector, and said second terminal connected to the junction of said second resistor and said second capacitor;
   j) a DC supply voltage terminal means connected to the junction of said second resistor and said second capacitor;
   k) a resonator means connected to said emitter, said resonator means having a first end, a second end and a tap, said first end connected to ground, said second end connected to a tuning voltage input means and said tap connected to said emitter, said resonator means responsive to said tuning voltage input means; and
   l) a third resistor and a fourth capacitor connected in parallel, said third resistor and said fourth capacitor connected in series with said tap and said emitter.

2. The oscillator circuit of claim, 1 said tap positioned at a point in the range of 0.3 to 5.0 of the length of said resonator as measured from the first end of said resonator means.

3. The oscillator circuit of claim 1, wherein said resonator means further comprises:
   a) a resonator having a first terminal and a second terminal, said second terminal connected to ground;
   b) a varactor diode having a first positive terminal and a second negative terminal, said first positive terminal connected to said first terminal of said resonator;
   c) a third inductor having a first terminal and a second terminal, said first terminal connected to said second terminal of said varactor diode;
   d) a fourth capacitor having a first terminal and a second terminal, said first terminal connected to the junction of said third inductor and said second terminal of said varactor diode, and said second terminal connected to ground; and
   e) a tuning voltage input terminal means connecting to said second terminal of said third inductor.

4. The oscillator circuit of claim 1, said tap positioned at a point in the range of 0.3 to 0.5 of the length of said resonator as measured from said second end of said resonator.

5. The oscillator circuit of claim 1, wherein said third capacitor has an impedance in the range of −j40 to −j60.

6. The oscillator circuit of claim 1, wherein said first inductor has an impedance in the range of j20 to j30 ohms.

7. The oscillator of claim 1, wherein said resonator means further comprises a microstrip line.

8. The oscillator circuit of claim 1, wherein the phase noise characteristics are about −88 dBC/Hz at 1 kHz offset, and −110 dBC/Hz at 10 kHz offset, at a carrier frequency of about 1.4 Ghz.

* * * * *